(12) United States Patent
Aizawa

(10) Patent No.: US 8,040,144 B2
(45) Date of Patent: Oct. 18, 2011

(54) INTERFACE CIRCUIT

(75) Inventor: Hiroyuki Aizawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 637 days.

(21) Appl. No.: 12/078,291

(22) Filed: Mar. 28, 2008

(65) Prior Publication Data

US 2008/0238491 A1 Oct. 2, 2008

(30) Foreign Application Priority Data

Mar. 30, 2007 (JP) ................... 2007-091694

(51) Int. Cl.
*G01R 27/08* (2006.01)
*H03K 5/22* (2006.01)
*H04B 17/00* (2006.01)

(52) U.S. Cl. ....... 324/713; 327/65; 455/218; 455/226.1; 375/224

(58) Field of Classification Search .................. 324/713; 327/65; 455/218, 226.1; 375/224
See application file for complete search history.

(56) References Cited

U.S. PATENT DOCUMENTS

| | | | | |
|---|---|---|---|---|
| 5,436,934 A | * | 7/1995 | Co | 375/351 |
| 5,940,448 A | * | 8/1999 | Kuo | 375/316 |
| 5,996,102 A | * | 11/1999 | Haulin | 714/740 |
| 6,833,738 B2 | * | 12/2004 | Nakada | 327/58 |
| 6,859,645 B2 | * | 2/2005 | Yu | 455/222 |
| 6,977,960 B2 | * | 12/2005 | Takinosawa | 375/224 |
| 7,218,136 B2 | * | 5/2007 | Kasahara | 326/30 |
| 7,466,156 B2 | * | 12/2008 | Marsh et al. | 324/750.3 |
| 2005/0047499 A1 | * | 3/2005 | Wood | 375/224 |
| 2005/0169356 A1 | * | 8/2005 | Matsumoto et al. | 375/220 |
| 2005/0236004 A1 | * | 10/2005 | Magnuson et al. | 128/898 |
| 2006/0253296 A1 | * | 11/2006 | Liisberg et al. | 705/1 |
| 2007/0127614 A1 | * | 6/2007 | Kawakami | 375/373 |

FOREIGN PATENT DOCUMENTS

JP 2005-267124 9/2005

* cited by examiner

*Primary Examiner* — Timothy J Dole

(74) *Attorney, Agent, or Firm* — McGinn Intellectual Property Law Group, PLLC

(57) ABSTRACT

An interface circuit includes a reference voltage generation circuit to generate a reference voltage, a differential voltage signal generation circuit to convert send data input in sending data into a pair of differential voltage signals and output the pair of differential voltage signals based on the reference voltage generated by the reference voltage generation circuit, a receiver to convert a pair of differential voltage signals input in receiving data and output received data, and a receiver test circuit to perform a sensitivity test of the receiver, the receiver test circuit having a resistance circuit to generate a pair of differential voltage signals having a potential difference being necessary for the sensitivity test of the receiver.

22 Claims, 7 Drawing Sheets

INTERFACE CIRCUIT

BACKGROUND OF THE INVENTION

1. Field of the Invention

The present invention relates to interface circuits converting send data into a pair of differential voltage signals and outputting the pair of differential voltage signals in sending data, and converting the pair of differential voltage signals received into a former data and outputting the former data in receiving data.

2. Description of Related Art

Recently, serial communications have been spread one of them includes a receiver which needs predetermined receiving sensitivity. For example, in USB specification which is one of the serial communications, as shown in FIG. 5, in the case where a differential voltage of a differential voltage signal is equal to or more than 150 mV and equal to or lower than −150 mV, it is specified that the signals are received as normal signals. In the case where a differential voltage of a differential voltage signal which is input signal is from −100 mV to 100 mV, the signal is cut off because it is squelch condition. As just described, because USB specification requires a high receiving sensitivity, it is desired to confirm a receiving sensitivity accurately and easily.

Here, Japanese Unexamined Patent Application Publication No. 2005-267124 (Yoshimoto) describes a transceiver interface which can estimate a sensitivity of a receiver (receiver for reception). As shown in FIG. 6, a transceiver interface 250 of the prior art realizes a data transfer of serial bus specification by converting send data into a pair of differential voltage signals and outputting it in sending data, and converting the received pair of differential voltage signals into a former data and outputting it in receiving data.

The transceiver interface 250 includes a reference voltage generation circuit 211. The reference voltage generation circuit 211 receives a power supply voltage VDD and a ground power supply voltage VSS and then generates a reference voltage signal. Further the transceiver interface 250 includes an inverter 212 and a pair of current driven drivers 213, 214. The send data is converted into the pair of differential voltage signals by the inverter 212 and a pair of current driven drivers 213, 214. The voltage level of the pair of differential voltage signals is determined by the reference voltage and a termination resistor as described below. The transceiver interface 250 further includes a receiver 215. The receiver 215 converts the pair of differential voltage signals which is received data into the former data.

The transceiver interface 250 further includes a sending data input terminal 201, a power supply input terminal 202, a ground supply input terminal 203, a received data output terminal REC 204, and differential voltage signal input and output terminals DP205, DM206. The differential voltage signal input and output terminals DP205, DM206 are connected to serial cable and input and output a pair of a differential voltage signals.

The transceiver interface 250 can input a voltage signal which is input from an external device and has arbitrary voltage level to the pair of current driven drivers 213, 214. In this way, the reference voltage generation circuit 211 has a first switch circuit (not shown) and a second switch circuit 216. The second switch circuit 216 is connected to a signal input terminal AAP and inputs the voltage signal which has arbitrary voltage level from an external device to the pair of current driven drivers 213, 214. The reference voltage generation circuit 211 is controlled by the first switch circuit so as to input the reference voltage signal to the pair of current driven drivers 213, 214 at normal timing and to shut off supply of the reference voltage signal at test timing.

A switch circuit switches a voltage signal which is input to the pair of current driven drivers 213, 214 to the reference voltage signal from the reference voltage generation circuit 211 or a voltage signal from the signal input terminal AAP207 based on a control signal from a first control terminal 208 connected to the switch circuit which has the second switch circuit 216 and the first switch circuit.

FIG. 7 is a view showing a specific example of the current driven driver. A reference voltage signal which is generated by a reference voltage generating circuit 251 is input to an input terminal 241 of a current driven driver 220. The current driven driver 220 includes send data input terminal 242 to which send data is inputted and a differential voltage signal output terminal 243 to which a reference voltage signal is input. The differential voltage signal output terminal 243 is connected to a differential voltage signal input and output terminal DP205. The current driven driver 220 corresponds to a current driven driver 213. Note, a current driven driver connected to a differential voltage signal input and output terminal DM has a same constitution and operation as above described, therefore the explanation is omitted.

The current driven driver 220 has an operational amplifier 221, P channel transistors 222-225, and N channel transistors 226-228 and transistors 222 and 223, 224 and 225, and 226 and 227 of those transistors configure current mirrors.

A constant current $I_3$ is determined by a voltage level Vref input to a reference voltage input terminal 241 and a current mirror ratio and a driver flowing the constant current $I_3$ is configured. When a signal level of send data is H, the transistor is turned on by terminating a differential voltage signal output terminal 243 with external resistors 230, 231. Then the constant current I3 flows in the external resistors 230, 231 and the voltage level of the differential voltage signal output terminal 243 is determined. That is, if a current flowing in the transistor 225 is $I_3$, and resistances of the resistors 231, 232 are Rs1, Rs2, a voltage of the differential output voltage signal terminal 243 is Vdp=$I_3$((1/Rs1)+(1/Rs2)). On the other hand, when a signal level of send data is L, since transistor 228 is turned off, the constant current $I_3$ does not flow and a voltage level of the differential voltage signal output terminal 243 becomes GND. Thus, the voltage level of the differential voltage signals is determined by the voltage level input to the reference voltage input terminal 241 and resistances of the external resistances 230, 231.

In this prior art, at the sensitivity test of the receiver for itself, the differential voltage signal terminals DP205, DM206 of FIG. 6 are connected to the external resistance. When the signal input terminal AAP is enabled by the control terminal 208, and a voltage signal input from the signal input terminal AAP207 is input to a pair of the current driven drivers 213, 214, a constant current which is proportional to a voltage level which is input is output from the pair of the current driven drivers 213, 214 according to the signal level of the send data. The constant current is flowed in the external resistance, and the voltage level of the differential voltage signal terminals DP205, DM206 are determined, and then a potential difference between the differential voltage signal terminals DP205 and DM206 are generated. The differential signal of the potential is performed whether or not the receiver receives the signal.

Therefore, the sensitivity test of the receiver for itself is performed by inputting an arbitrary voltage level from an external device by using the signal input terminal AAP207 and generating a voltage level corresponding to the arbitrary voltage level in the differential voltage signal terminals DP205 and PM206.

However, according to the transceiver interface 250 of the prior art, there is a problem that an own power supply unit is needed since an arbitrary voltage level is supplied from an external device. Recently, with multi-functionalization by SOC (System On Chip), LSI gets to have many power supplies. Therefore it is not realistic to use a dedicated power supply unit in test. Further there is another problem that a test accuracy becomes low by an external effect such as an accuracy of a voltage supply source or a voltage drop with supplying a power supply from an external device.

SUMMARY

According to one aspect of the present invention, there is provided an interface circuit comprising a reference voltage generation circuit to generate a reference voltage, a differential voltage signal generation circuit to convert send data input in sending data into differential voltage signals and output the pair of differential voltage signals based on the reference voltage generated by the reference voltage generation circuit, a receiver to convert a pair of differential voltage signals input in receiving data and output received data, and a receiver test circuit to perform a sensitivity test of the receiver, the receiver test circuit having a resistance circuit to generate a pair of differential voltage signals having a potential difference being necessary for the sensitivity test of the receiver.

In the invention, differential voltage signals having a desired potential level can be generated by including the resistance circuit to be capable of generating a pair of differential voltage signals having a potential difference which is necessary for the sensitivity test of the receiver. Therefore an external special power supply unit and resistance are not necessary at the sensitivity test of the receiver.

The invention can provide the interface circuit to prevent a test accuracy from being decreased and a cost from being increased by external influence of the sensitivity test of the receiver.

BRIEF DESCRIPTION OF THE DRAWINGS

The above and other objects, advantages and features of the present invention will be more apparent from description of certain preferred embodiments taken in conjunction with the accompanying, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
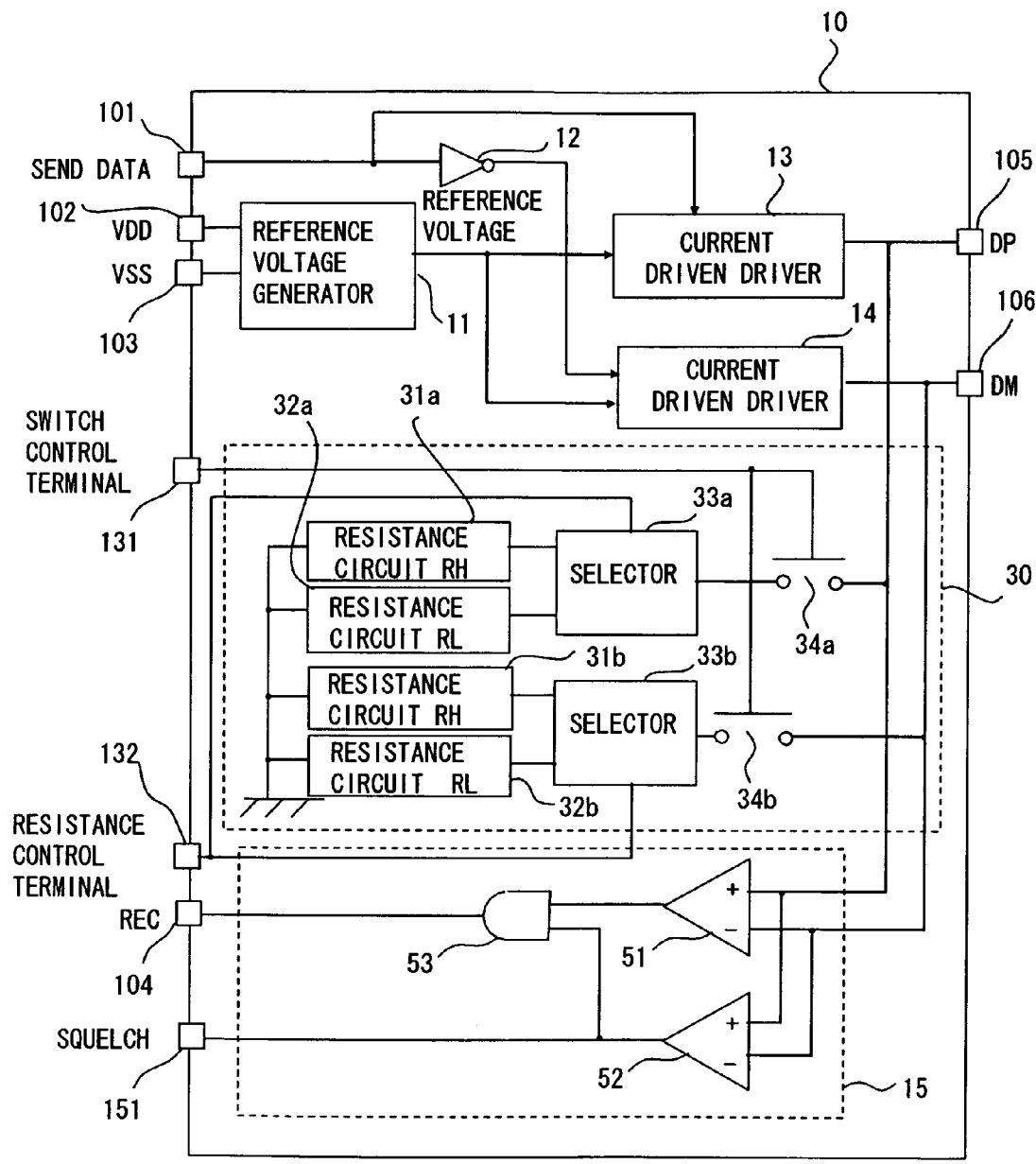
FIG. 1 is a view for showing an interface circuit of the embodiment.
Figure 6:
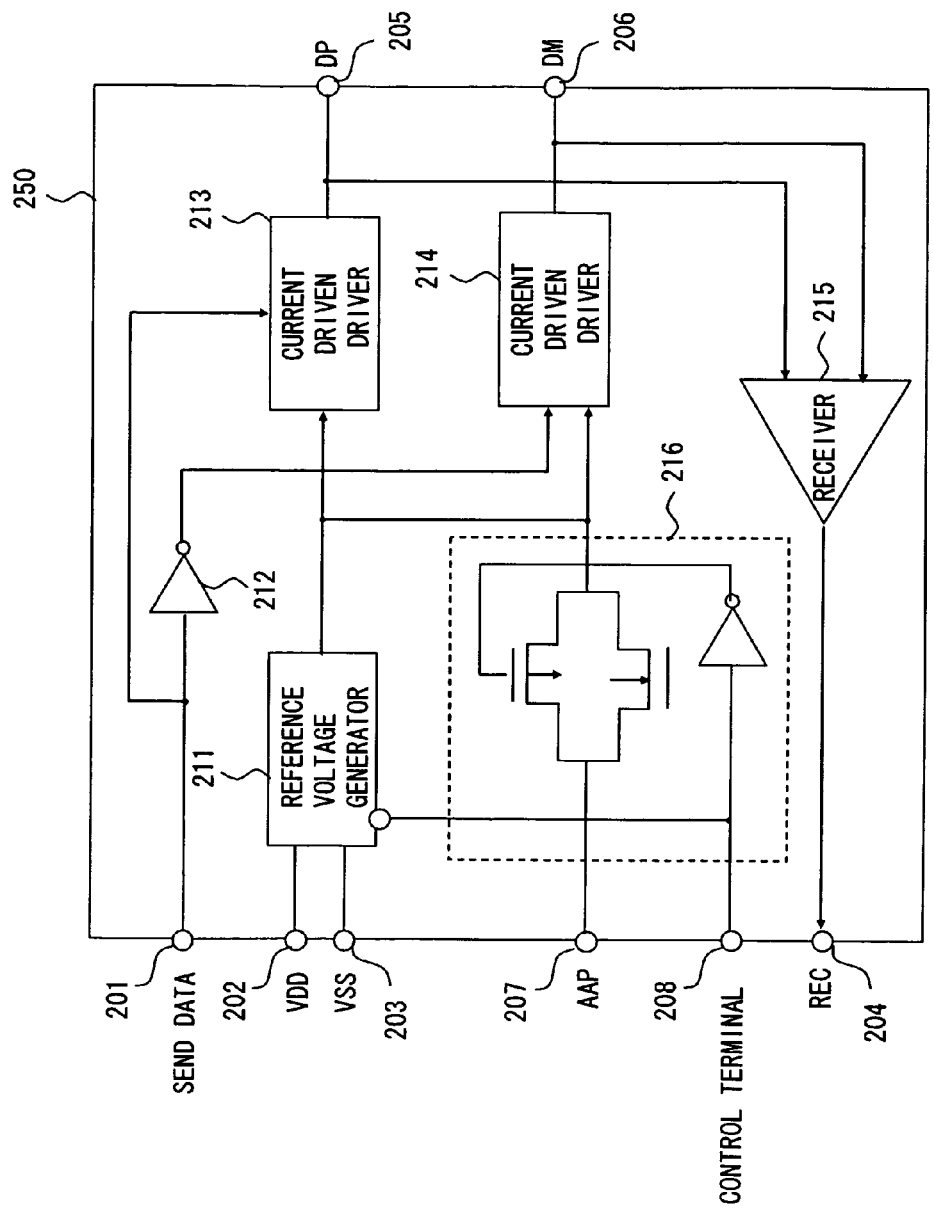
FIG. 6 is a view showing an interface circuit of the prior art.
Figure 7:
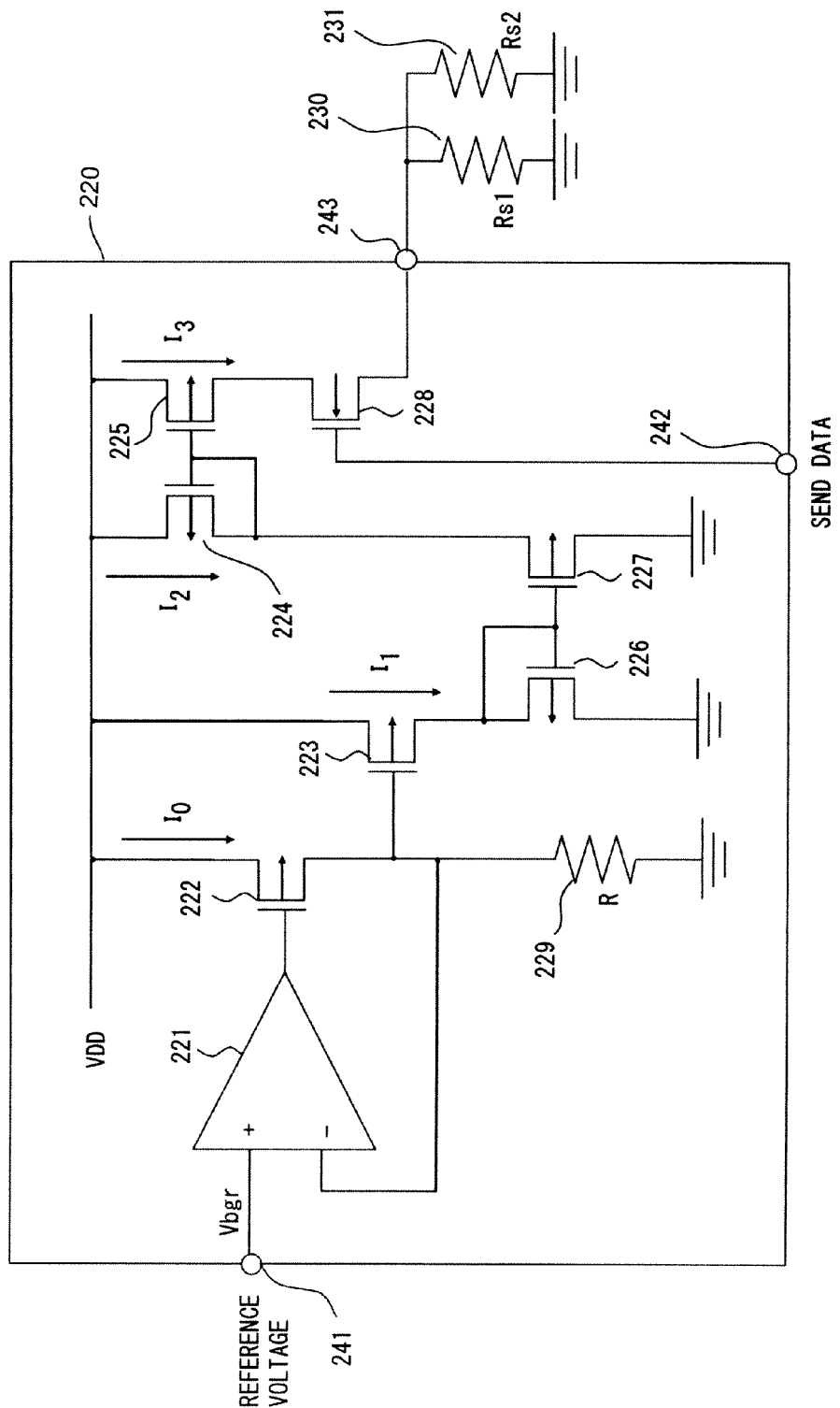
FIG. 7 is a view showing a specific example of the current driven driver of the interface circuit of the prior art.

The specific embodiment to which the present invention is applied will now be described in detail with reference to the drawings. FIG. 1 is a view for showing an interface circuit of the embodiment. An interface circuit 10 of the present invention has a receiver test circuit 30 in place of the second switch circuit 216 of FIG. 6 and sets a potential difference of a differential voltage signal to a desired voltage without using a power supply for test.

The interface circuit 10 realizes a data transfer of serial bus specification by converting send data into a pair of differential signals in sending data and converting the pair of differential signals into former data in receiving data.

As shown in FIG. 1, the interface circuit 10 includes a reference voltage generator 11. The reference voltage generator 11 receives a power supply VDD supplied from a power supply input terminal 102 and a ground power supply voltage VSS supplied from a ground power supply input terminal 103 and generates a reference voltage signal. The interface circuit 10 further includes an inverter 12 and a pair of current driven drivers 13, 14. The inverter 12 and the pair of current driven drivers 13, 14 constitute a differential voltage signal generator which converts send data into a pair of differential voltage signals in sending data, and the send data is converted into the pair of differential voltage signals. As described hereinbelow in detail, a voltage level of the pair of differential voltage signals is determined by a reference voltage and a terminal resistance at normal operating time. At a time of testing, the voltage level is determined by the reference voltage and the receiver test circuit 30. Note that, a current value of a constant current output from a current driven driver is determined by serial bus specification when reference current is input to the current driven drivers 13 and 14.

The interface circuit 10 includes a receiver 15. The receiver 15 converts a pair of differential voltage signals (DP), (DM) input from the differential voltage signal input and output terminals DP105, DM106 in receiving data and generates received data. Thus, the receiver 15 converts the pair of differential voltage signals which are received data into former data and outputs the converted data from the REC terminal 104. The differential voltage signal input and output terminals DP105, DM106 are connected to serial cables and the pair of differential voltage signals is input or output.

Further, the interface circuit 10 includes the receiver test circuit 30 which performs a sensitivity test of the receiver 15. The receiver test circuit 30 houses a resistance circuit which generates a pair of differential voltage signals having a potential difference which is necessary for the sensitivity test of the receiver 15.

That is, the receiver test circuit 30 includes first resistance circuits 31a, 31b, second resistance circuits 32a, 32b, selectors 33a, 33b and switch circuits 34a, 34b corresponding to the current driven drivers 13, 14 respectively. The first resistance circuits 31a, 31b generate a pair of differential voltage signals whose potential difference is a first value corresponding to a sensitivity specification which is required for the receiver. The second resistance circuits 32a, 32b generate a pair of differential voltage signals whose potential difference is a second value which is smaller than the sensitivity specification which is required for the receiver. The resistance circuits 31a, 31b, 32a and 32b are connected to the GND.

The selectors 33a, 33b are controlled so as to select the resistance circuits 31a, 32a or 31b, 32b respectively by selector control signals from a resistance control terminal 132 at test timing. ON and OFF of the switches 34a, 34b are controlled by switch control signals from a switch control terminal 131, and the switches 34a, 34b are turned on at test timing and connect the resistance circuits 31a, 31b or the resistance circuits 32a, 32b and the current driven drivers 13, 14 through the selectors 33a, 33b respectively.

Here, the resistance circuits 31a, 31b, 32a, 32b include resistance circuits having resistances which can generate differential signals having a potential difference of a sensitivity specification required for the receiver. In the embodiment, the resistance circuits RL32a, 32b have resistances which generate differential signals whose potential difference is the second value, which are cut off as a noise signal, and the resistance circuits RH31a, 31b have resistances which generate differential signals whose potential difference is the first value, which are received as a normal signal.

For example, in USB specification, in the case where a potential difference of differential voltage signals which are input signals is ±100 mV, the receiver turns squelch and cuts off the input signal. In the case where a potential difference of differential voltage signals is equal to or higher than 150 mV or equal to or lower than −150 mV, the input signal is determined as normal. Therefore resistances of the second resistance circuits 32a, 32b consist of resistances which generate differential outputs whose absolute values of output potential differences are 100 mV. Then resistances of the first resistance circuits 31a, 31b consist of resistances which generate differential outputs whose absolute values of output potential differences are 150 mV. Note, the way to decide the resistance is described below. Further, needless to say, the resistance circuit can be configured to generate needful potential difference arbitrarily.

The resistance circuits 31a, 31b, 32a, and 32b can be composed of resistor conditioning circuits or variable resistors. The resistor conditioning circuit has a conditioning circuit to be capable of controlling a resistance value to operate a circuit properly even if the resistance value is out of a desired value. If the resistance circuit is composed of a resistor conditioning circuit, since the resistance value can be set to a desired value, the resistance value can be set accurately. If the resistance circuit is composed of a variable resistor, the resistance value can be set to an arbitrary value from an external device. Therefore, since a differential potential of a differential signal can be variable arbitrarily, the receiver test circuit 30 can estimate a sensitivity of the receiver more accurately.

The receiver 15 may only include a receiver circuit 51 which outputs data corresponding to send data input to the REC terminal 104 when differential signals whose potential difference is determined as normal is input. However, in the embodiment of the invention, the receiver 15 is configured so as to output L level to the REC terminal 104 when a differential signal whose potential difference indicates squelch is input. More specifically, as shown in FIG. 1, the receiver 15 can include a squelch detect circuit 52 which detects squelch condition and a mask circuit 53 which outputs a logical addition of the squelch detect circuit 52 and the receiver circuit 51 as well as the receiver circuit 51 which converts a pair of differential voltage signals into received data. The squelch detect circuit 52 outputs L level to a squelch determined terminal 151 when a differential signal having a potential difference which turns on squelch is input, and outputs H level to the squelch determined terminal 151 when a differential signal having a potential difference which is determined as a normal signal is input. Therefore, by determining a signal level which is output to the squelch determined terminal 151, the determination of the squelch condition can be tested easily. Further when differential signals having a potential difference which turns on squelch are input to the receiver circuit 51, the mask circuit 53 can mask data of the receiver circuit 51 and cut off an output of data by configuring the mask circuit 53 to implement a logical addition of the receiver circuit 51 and the squelch detect circuit 52.

Next, the operation of the receiver test circuit 30 of the embodiment will be discussed. As shown in FIG. 1, the switches 34a, 34b are turned on at test timing, and then the resistance circuits RH31a, 31b or the resistance circuits RL32a, 32b are terminated to the current driven drivers 13, 14 by selector control signal from the resistance control terminal 132. When a signal level of send data is H, a constant current flows from the current driven driver 13 to the resistance circuits RH31a, 31b or the second resistance circuits RL32a, 32b and a voltage level of a differential voltage signal (DP) is determined. On the other hand, since a signal having L level is input to the current driven driver 14 from the inverter 12, constant current does not flow to the current driven driver 14, and a voltage level of the differential voltage signals becomes GND. This will enable to obtain differential signals whose potential difference satisfies a relationship that a voltage level of a differential voltage signal input and output terminal DP>a voltage level of a differential voltage signal input and output terminal DM.

On the contrary, when a signal level of send data is L, a voltage level of the differential voltage signal (DP) becomes GND, and then a constant current flows to the current driven driver 14 and then the constant current flows to the resistance circuits RH31a, 31b or the resistance circuits RL32a, 32b which are termination resistors and a voltage level of the differential voltage signal (DM) is determined. In this case, differential signals whose potential difference satisfies a relationship that a voltage level of a differential voltage signal input and output terminal DM>a voltage level of a differential voltage signal input and output terminal DP can be obtained.

Hereinafter the operation of the embodiment will be described in detail. For example, in USB, it is defined that a constant current of 17.78 mA is flowed to the current driven drivers 13, 14. By incorporating resistors which have resistance values 8.44Ω preliminarily in the resistance circuits RH31a and 31b, in the case where a signal level of send data is H, voltage levels of the reference voltage signals are as follows.

The differential voltage signal (DP): V=I×R=17.78 mA×8.44Ω=150 mV (VD+)
The differential voltage signal (DM): V=I×R=0 mA×8.44Ω=0 mV (VD−)
Therefore the differential signals which have a potential difference (VD+)−(VD−)=150 mV (DP>DM) can be obtained.

On the other hand, when a signal level of send data is L, differential signals which have a potential difference of (VD−)−(VD+)=150 mV (DM>DP) can be obtained and can be input to the receiver, and a test of a receiving sensitivity that the signals are determined as a normal signal can be performed. Further by incorporating resistances which have low resistance value 5.63Ω in the resistance circuits RL32a, 32b, in the case where a signal level of send data is H, voltage levels of the differential voltage signals are as follows.
The differential voltage signal (DP): V=I×R=17.78 mA×5.63Ω=100 mV (VD+)
The differential voltage signal (DM): V=I×R=0 mA×5.63Ω=0 mV (VD−)
Therefore the differential signals having a potential difference (VD+)−(VD−)=100 mV (DP>PM) can be obtained. On the other hand, in the case where a signal level of send data is L the differential signals which have a potential difference (VD−)−(VD+)=100 mV (DM>DP) can be obtained and it can be input to the receiver and a test of a receiving sensitivity that the signals are determined as squelch can be performed.

Figure 2:
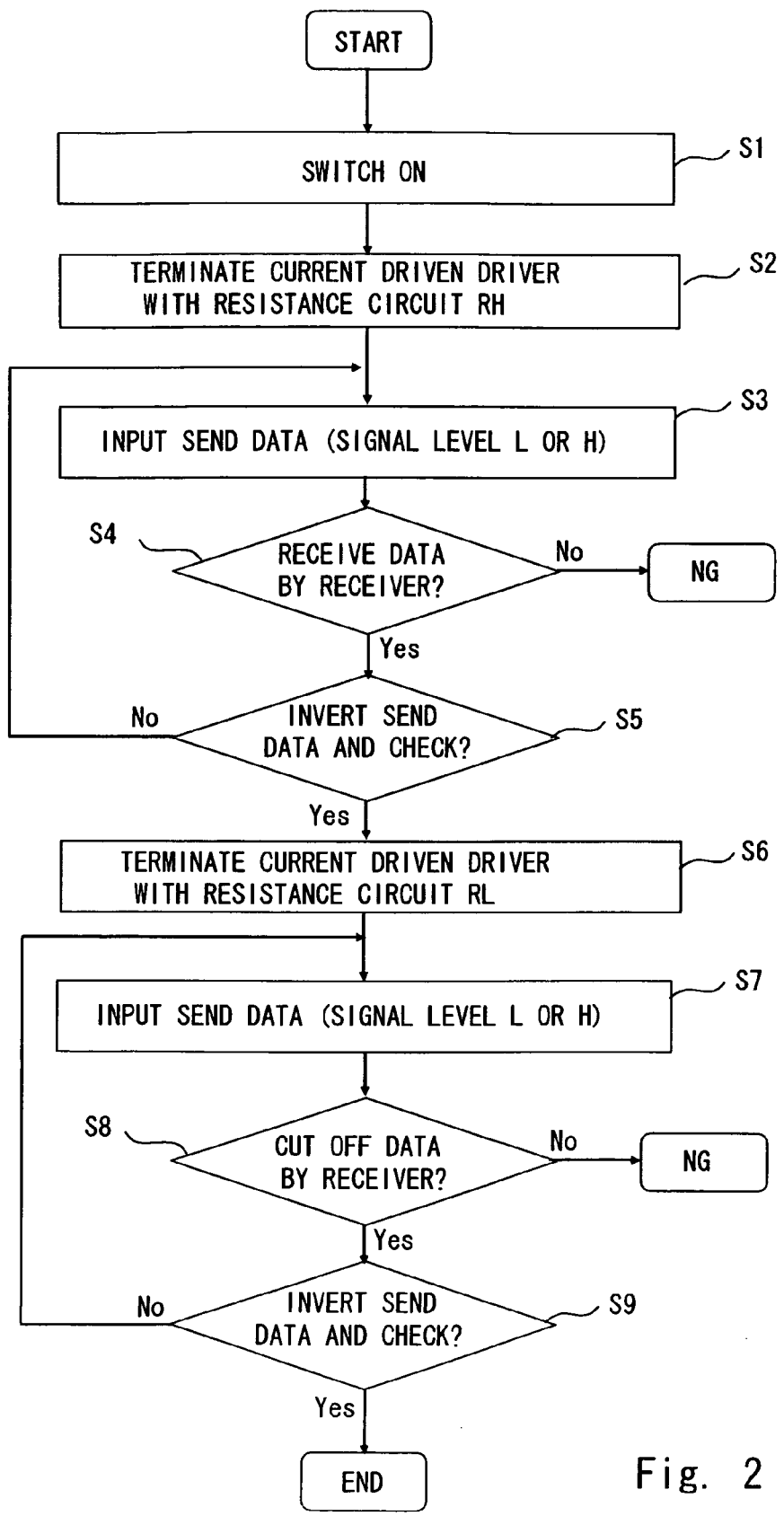
FIG. 2 is a flow chart showing the sensitivity test of the receiver.

Next, the sensitivity test of the receiver of the interface circuit of the present invention will be described. FIG. 2 is a flow chart showing the sensitivity test of the receiver. Firstly, the switches 34a, 34b are turned on by the switch control signal from the switch control terminal 131 (step S1). Next, the resistance circuits 31a, 31b are selected by the selector control signal from the resistance control terminal 132 and the current driven drivers 13, 14 are terminated by the resistance circuits 31a, 31b (step S2). In this condition, the send data is input from the send data input terminal 101 (Step S3). For example, "H" data is input. Then the data, which is input in step S3 and output from the REC terminal 104 is monitored (step S4). Here, in the case where the receiver 15 does not receive the data, that is, the data is not output from the REC terminal 104, it is determined that the sensitivity test has failed.

Here, in the embodiment, a potential difference of the differential signals which are generated by terminating the current driven drivers 13, 14 with the resistance circuits 31a, 31b is equal to or higher than 150 mA or equal to or lower than −150 mA. Therefore the difference signals are received by the receiver as normal signals. Consequently, if the output data of the REC terminal 104 corresponds to the send data, it is determined that the sensitivity test has passed, and if the output data does not correspond to the send data, it is determined that the sensitivity test has failed. Thus the sensitivity test of the receiver 15 is performed. Next, the send data is inverted (step S5), then the operation repeats from step S3, and it is confirmed that the send data can be received even if the send data is "L".

Next, the resistance circuits RL32a, 32b are selected by the selector control signal from the resistance control terminal 132 and the current driven drivers 13, 14 are terminated by the resistance circuits RL32a, 32b respectively (step S6). In this condition, the send data is input from the send data input terminal 101 (step S7). For example, "H" data is input. Then the data, which is input in step S7 and output from the REC terminal 104 is monitored (step S8). Here, the potential difference of the differential signals having a potential difference which is generated by terminating the resistance circuits RL32a, 32b is from −100 mv to 100 mV, therefore the receiver cut off the data as noise signals. Consequently, if the output data of the REC terminal 104 is L level, it is determined that the sensitivity test has passed, and if the output data of the REC terminal 104 is H level, it is determined that the sensitivity test has failed. Next, the send data is inverted (step S9), then the operation repeats from step S7, and it is confirmed that an output of the receiver 15 is "L" level even if the send data is "L".

As described above, the sensitivity test of the receiver 15 can be performed. Note that, in case where the resistance circuit is configured by the variable resistor, the sensitivity test of the receiver can be performed by changing the resistance from the external device, repeating steps S7 and S8, and confirming the potential difference of the differential signals where the fail or the pass determination is switched.

According to the embodiment, since the interface circuit has the resistance circuits 31a, 31b, 32a, 32b to generate desired voltage levels at the differential voltage signal terminals DP105, DM106, a special power supply unit and a resistance do not have to be externally provided. Therefore, according to a LSI having many power supplies, the special power supply unit is not necessary at the test timing, so an inexpensive tester can be used. Further, because external devices or components are not necessary, test can be performed with high accuracy without an external influence, thereby a cost of the test can be reduced.

Further, according to the embodiment, the current driven drivers 13, 14 are terminated by connecting the current driven drivers 13, 14 to the resistance circuits 31a, 31b, 32a, and 32b at the test timing. In this way, it is not needed to connect the differential voltage signal input and output terminals DP, DM to the external resistance to generate the voltage level. Therefore, it is possible to prevent the quality of the test from being lowed and the cost from being increased by influence of the quality of the external resistance. Note that, in case where there is no particular problem, the interface circuit can be connected to the external resistance in parallel as well as the resistance circuits 31a, 31b, 32a, and 32b to get a desired resistance value.

Second Embodiment

The second embodiment of the present invention will be described. The interface circuit of the embodiment includes a send data generation circuit and a received data check circuit. The interface circuit starts the send data generation circuit and the received data check circuit according to a start signal from the test control terminal 141 and the received data check circuit outputs a determination result pass/failed of the receiver 15 from the test determination terminal 142.

Figure 3:
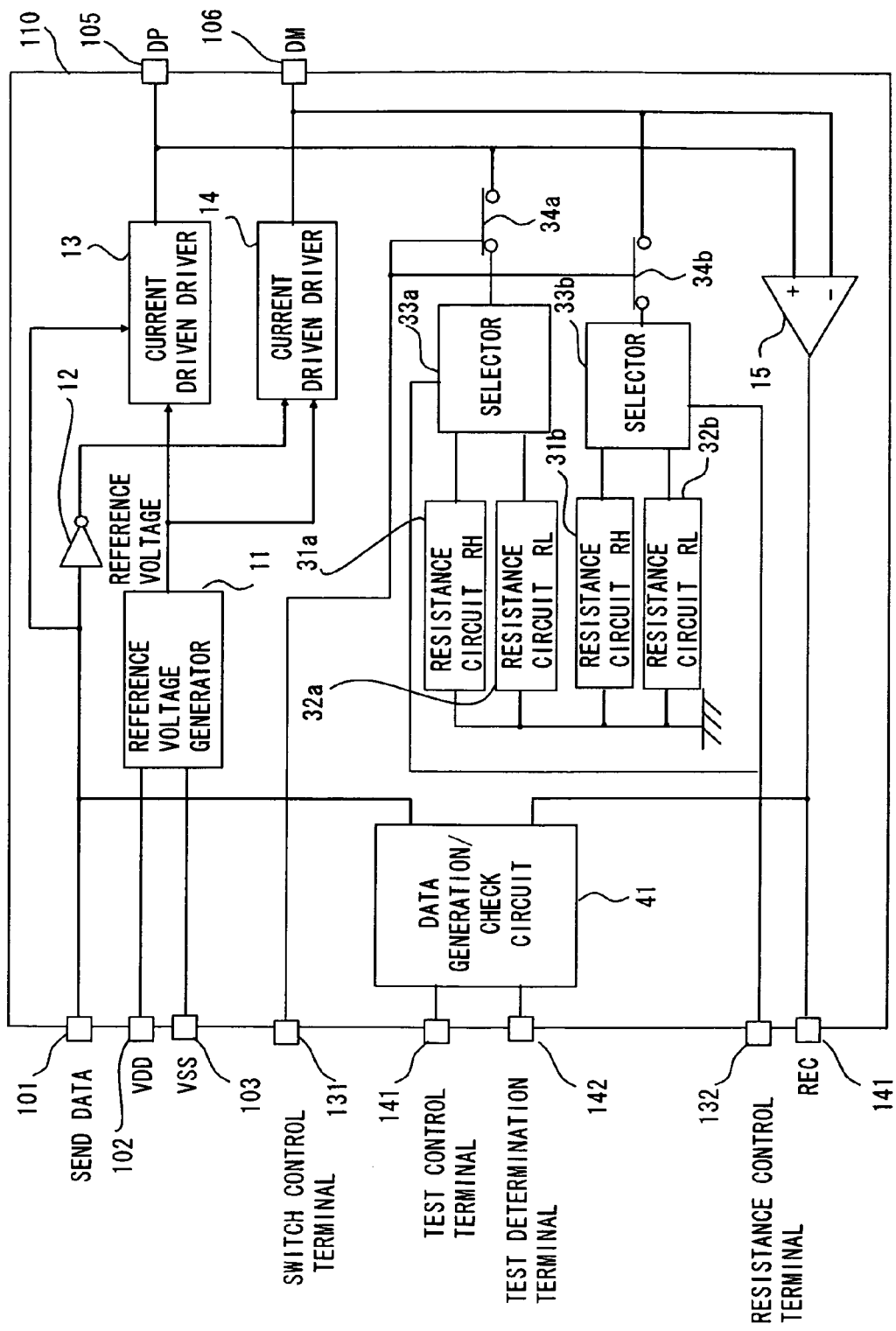
FIG. 3 is a diagram showing an interface circuit of the embodiment.

FIG. 3 is a view showing an interface circuit of the embodiment. In the present embodiment shown in FIG. 3, the same components as the interface circuit according to the first embodiment shown in FIG. 1 are denoted by the same reference numerals and not described in detail herein. As shown in FIG. 3, the interface circuit has the send data generation circuit and check circuit 41, which is referred to herein as the data generation/check circuit 41. The data generation/check circuit 41 is turned on the start signal at the test operation. Then the data generation/check circuit 41 generates the send data, and inputs the send data to the current driven driver 13 directly and to the current driven driver 14 through the inverter 12. Further, the data converted by the receiver 15 is input to the data generation/check circuit 41. The data generation/check circuit 41 compares this received data with the send data generated by the circuit 41 and outputs the pass or failure result from the test determination terminal 142. Note that, according to the embodiment, although the data generation/check circuit 41 is explained as one circuit having both functions of the send data generation circuit and the received data check circuit, the interface circuit can have these two circuits separately.

Figure 4:
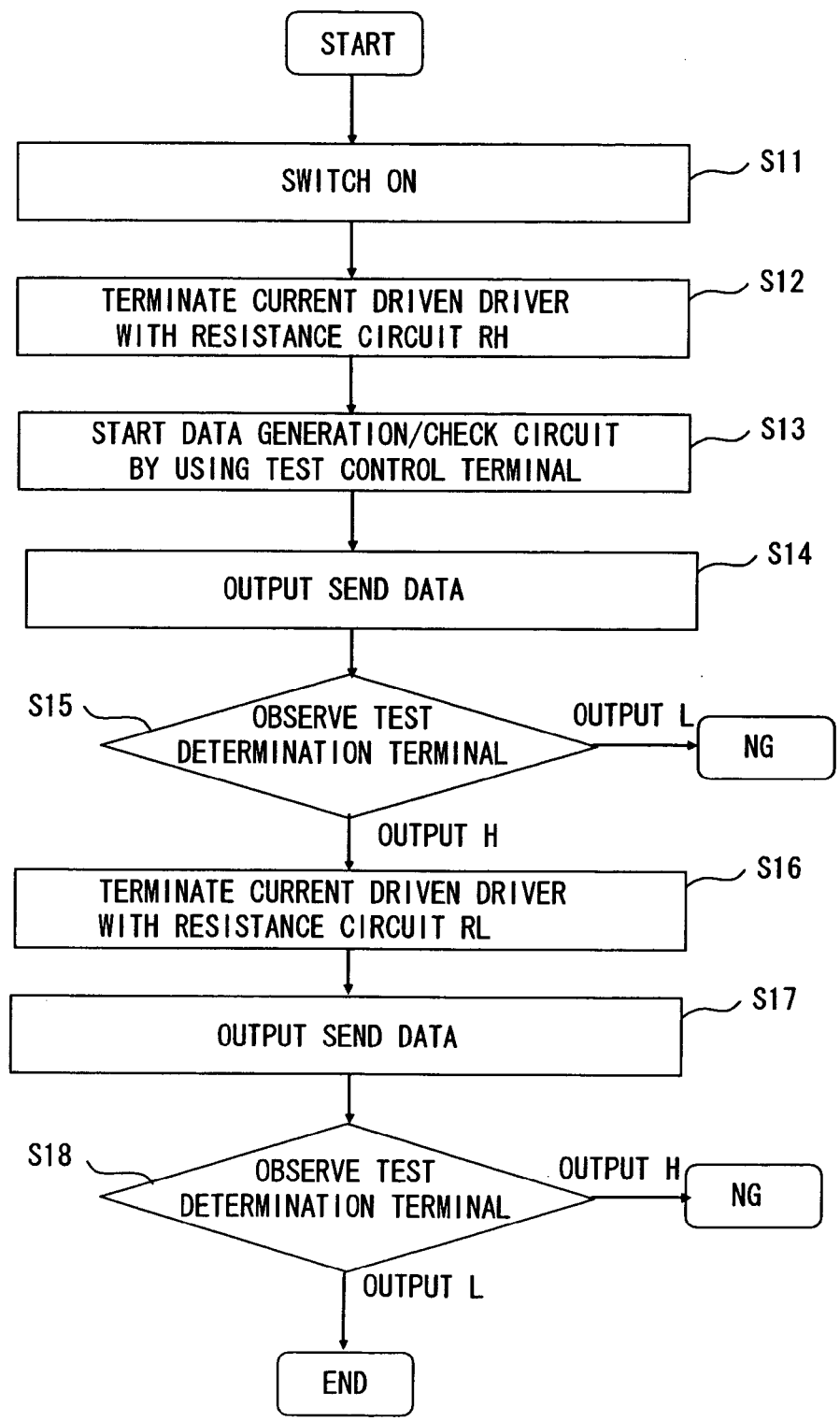
FIG. 4 is a flow chart showing an operation method at the test timing.
Figure 5:
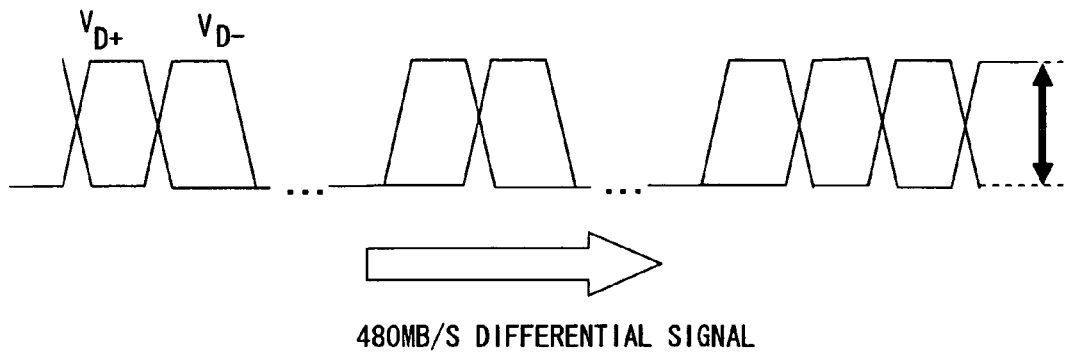
FIG. 5 is a view explaining a receiving sensitivity of USB specification which is one of a serial communications.
Figure 5:
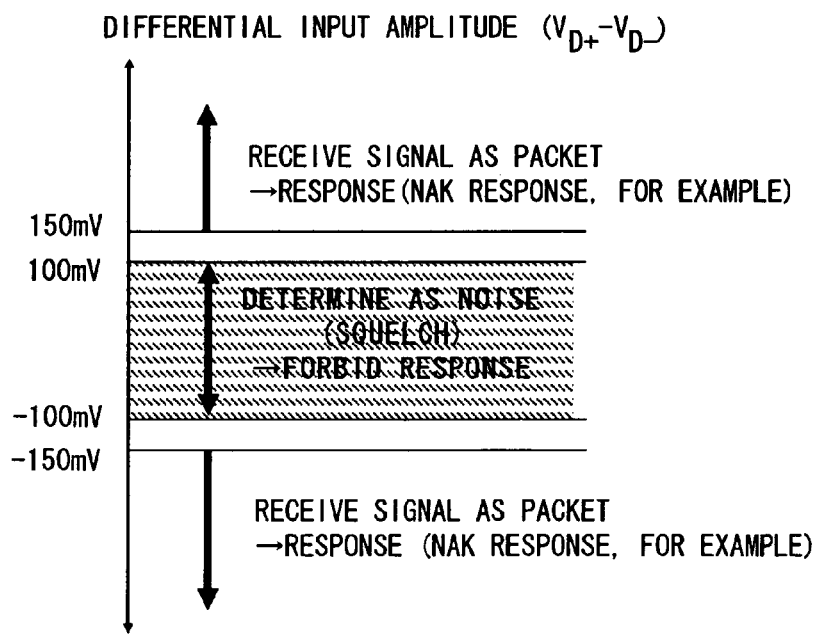

Next the operation of the interface circuit of the embodiment at the test will be described. FIG. 4 is a flow chart showing an operation method at the test timing. Firstly, the switches 34a, 34b are turned on by a switch control signal from the switch control terminal 131 (step S11). Next, the resistance circuits RH31a, 31b are selected by a selector control signal from the resistance control terminal 132 to terminate the current driven drivers 13, 14 with the resistance circuits RH31a, 31b respectively (step S12).

Then the start signal is input from the test control terminal 141 to start the data generation/check circuit 41 (step S13). Subsequently, the data generation/check circuit 41 sends the send data at a normal operation timing (At Speed) (step S14). Next, the data generation/check circuit 41 compares the send data which is sent by itself with the received data which is output from the receiver 15 after receiving the send data. Here, in the embodiment, a signal having a potential difference generated by terminating the current driven drivers 13, 14 with the resistance circuits RH31a, 31b is received by the receiver 15 as a normal signal. Therefore, the data generation/check circuit 41 compares the send data with the received data and determines that the sensitivity test has passed if the two data accord with each other, and the sensitivity test has failed if the two data do not accord with each other. Then for example, if the comparing result is corresponding, the determination is pass and H level signal is output, and if the comparing result does not accord, the determination is fail and L level signal is output to the test determination terminal 142 (step S15). Note that, although the detail is omitted, in steps S14, S15, both of the send data which are "H" data and "L" data are sent and the pass or failure determination is performed by observing the test determination terminal.

Next the selector control signal is input from the resistance control terminal 132 to select the second resistance circuits 32a, 32b and the current driven drivers 13, 14 are terminated by the second resistance circuits RL32a, 32b (step S16). In this condition, the data generation/check circuit 41 sends the send data (step S17), and the test determination terminal 142 is observed (step S18). As described above, the signal having a potential difference generated by terminating the current driven drivers 13, 14 with the second resistance circuits 32a, 32b is a signal which is cut off by receiver as noise data. Therefore the data generation/check circuit 41 can determine that the sensitivity test has failed if the received data accord the send data, and the sensitivity test has passed if the received data is L even if the send data is H level or L level. The data generation/check circuit 41 outputs the result from the test determination terminal 142. Therefore, the pass or failure of the receiver 15 can be determined by observing the test determination terminal 142.

According to the embodiment, the sensitivity test of the receiver 15 at actual operation speed (At-Speed) with loop back test can be performed by having the data generation/check circuit 41 as well as having the same effect of the first embodiment.

It is apparent that the present invention is not limited to the above embodiments, but may be modified and changed without departing from the scope and spirit of the invention. For example, the receiver sensitivity test can be performed as long as the receiver is the transceiver consisting of the current driven driver and the resistance element regardless of above embodiments. In particular, according to the transceiver of serial ATA or IEEE1394, if the resistor having a resistance value generating a potential difference corresponding to a receiving sensitivity specification is incorporated in the interface circuit, the sensitivity test can be performed similarly.

What is claimed is:

1. An interface circuit comprising:
   a reference voltage generation circuit to generate a reference voltage;
   a differential voltage signal generation circuit to convert send data into a first pair of differential voltage signals for data transmission and output the first pair of differential voltage signals, based on the reference voltage generated by the reference voltage generation circuit, to a pair of input/output terminals;
   a receiver to convert a second pair of differential voltage signals for data reception, from the pair of input/output terminals, into received data and output the received data; and
   a receiver test circuit to perform a sensitivity test of the receiver by controllably connecting with the differential voltage signal generation circuit and the receiver, the receiver test circuit including a resistance circuit to selectively generate a third pair of differential voltage signals having a potential difference for the sensitivity test of the receiver in accordance with a sensitivity specification required of the receiver.

2. The interface circuit according to claim 1, wherein the resistance circuit comprises:
   first resistance circuits to generate a first set of the third pair of differential voltage signals having a potential difference being a first value corresponding to a sensitivity specification necessary for the receivers; and
   second resistance circuits to generate a second set of the third pair of differential voltage signals having a potential difference being a second value less than the sensitivity specification.

3. The interface circuit according to claim 2, wherein the first resistance circuits generate differential voltage signals having potential difference indicating squelch, and the second resistance circuits generate differential voltage signals having potential difference determined as a normal signal.

4. The interface circuit according to claim 3, wherein the receiver comprises:
   a receiver circuit to convert the second pair of differential voltage signals and output the received data; and
   a squelch detection circuit to detect a squelch condition.

5. The interface circuit according to claim 3, wherein the resistance circuit includes a resistor conditioning circuit capable of conditioning a resistance value or a variable resistor capable of setting a resistance value from an external device.

6. The interface circuit according to claim 3, wherein the differential voltage signal generation circuit includes a first current driven driver to which the send data is input, a inverter to invert the send data and a second current driven driver to which the send data inverted by the inverter is input.

7. The interface circuit according to claim 3, further comprising:
   a send data generation circuit to generate a send data for test; and
   a send data check circuit to compare the send data for test generated by the send data generation circuit with the received data output from the receiver and determine a pass or failure of a sensitivity test of the receiver based on the comparison result.

8. The interface circuit according to claim 2, wherein the resistance circuit includes a resistor conditioning circuit capable of conditioning a resistance value or a variable resistor capable of setting a resistance value from an external device.

9. The interface circuit according to claim 2, wherein the differential voltage signal generation circuit includes a first current driven driver to which the send data is input, an inverter to invert the send data and a second current driven driver to which the send data inverted by the inverter is input.

10. The interface circuit according to claim 2, further comprising:
   a send data generation circuit to generate a send data for test; and
   a send data check circuit to compare the send data for test generated by the send data generation circuit with the received data output from the receiver and determine a pass or failure of the sensitivity test of the receiver based on the comparison result.

11. The interface circuit according to claim 1, wherein the receiver test circuit comprises:
   first resistance circuits to generate a first set of the third pair of differential voltage signals having a potential difference being a first value corresponding to a sensitivity specification being necessary for the receiver;

second resistance circuits to generate a second set of the third pair of differential voltage signals having a potential difference being a second value less than the sensitivity specification;

a selector to select the first resistance circuits or the second resistance circuits at test timing; and a switch to connect the first resistance circuits or the second resistance circuits to the differential voltage signal generation circuit through the selector at the test timing.

12. The interface circuit according to claim 11, wherein the first resistance circuits generate differential voltage signals having potential difference indicating squelch, and the second resistance circuits generate differential voltage signals having potential difference determined as a normal signal.

13. The interface circuit according to claim 12, wherein the receiver further includes a mask circuit to output a logical addition of the squelch detection circuit and the receiver circuit.

14. The interface circuit according to claim 11, wherein the resistance circuit includes a resistor conditioning circuit capable of conditioning a resistance value or a variable resistor capable of setting a resistance value from an external device.

15. The interface circuit according to claim 11, wherein the differential voltage signal generation circuit includes a first current driven driver to which the send data is input, an inverter to invert the send data and a second current driven driver to which the send data inverted by the inverter is input.

16. The interface circuit according to claim 11, further comprising:
a send data generation circuit to generate a send data for test; and
a send data check circuit to compare the send data for test generated by the send data generation circuit with the received data output from the receiver and determine a pass or failure of the sensitivity test of the receiver based on the comparison result.

17. The interface circuit according to claim 1, wherein the resistance circuit includes a resistor conditioning circuit capable of conditioning a resistance value or a variable resistor capable of setting a resistance value from an external device.

18. The interface circuit according to claim 1, wherein the differential voltage signal generation circuit includes a first current driven driver to which the send data is input, an inverter to invert the send data and a second current driven driver to which the send data inverted by the inverter is input.

19. The interface circuit according to claim 1, further comprising:
a send data generation circuit to generate a send data for test; and
a send data check circuit to compare the send data for test generated by the send data generation circuit with the received data output from the receiver and determine a pass or failure of the sensitivity test of the receiver based on the comparison result.

20. The interface circuit according to claim 1, wherein the receiver test circuit comprises the resistance circuit including a selective electrical communication with the differential voltage signal generation circuit and the receiver for the sensitivity test of the receiver determined according to the send data and the received data.

21. The interface circuit according to claim 1, wherein the resistance circuit within the receiver test circuit changes voltage levels at the pair of input/output terminals at a time of the sensitivity test.

22. An interface circuit comprising:
a reference voltage generation circuit to generate a reference voltage;
a differential voltage signal generation circuit to generate a first pair of differential voltage signals for transmission according to send data and the reference voltage generated by the reference voltage generation circuit, the differential voltage signal generation circuit outputting the first pair of differential voltage signals to a pair of input/output terminals for differential voltage signals;
a receiver to convert a second pair of differential voltage signals from the pair of input/output terminals into received data; and
a receiver test circuit to perform a sensitivity test of the receiver from the send data and the received data respectively from the differential voltage signal generation circuit and the receiver, the receiver test circuit including a resistance circuit to selectively generate a third pair of differential voltage signals having a potential difference for the sensitivity test of the receiver from selectively terminating the differential voltage signal generation circuit to change voltage levels at the pair of input/output terminals by the resistance circuit for the sensitivity test of the receiver in accordance with a sensitivity specification required of the receiver.

* * * * *